(12) United States Patent
Haeusler

(10) Patent No.: US 7,888,225 B2
(45) Date of Patent: Feb. 15, 2011

(54) METHOD OF MANUFACTURING AN ELECTRONIC DEVICE INCLUDING A PNP BIPOLAR TRANSISTOR

(75) Inventor: Alfred Haeusler, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 12/390,639

(22) Filed: Feb. 23, 2009

(65) Prior Publication Data

US 2009/0212393 A1    Aug. 27, 2009

Related U.S. Application Data

(60) Provisional application No. 61/141,799, filed on Dec. 31, 2008.

(30) Foreign Application Priority Data

Feb. 21, 2008    (DE) .................. 10 2008 010 323

(51) Int. Cl.
*H01L 21/331*    (2006.01)

(52) U.S. Cl. .................. 438/341; 438/349; 257/593; 257/E21.372

(58) Field of Classification Search .................. 438/341, 438/349; 257/593, E21.372

See application file for complete search history.

(56) References Cited

U.S. PATENT DOCUMENTS

| 6,228,732 B1 * | 5/2001 | Richardson et al. ......... 438/342 |
| 7,692,268 B2 * | 4/2010 | Prechtl et al. .............. 257/558 |
| 2007/0207567 A1 * | 9/2007 | Geiss et al. ................. 438/104 |

* cited by examiner

*Primary Examiner*—Zandra Smith
*Assistant Examiner*—Christy L Novacek
(74) *Attorney, Agent, or Firm*—Warren L. Franz; Wade J. Brady, III; Fredrick J. Telecky, Jr.

(57) ABSTRACT

A method of manufacturing an electronic device including a PNP bipolar transistor comprises forming a collector in a substrate, depositing a base layer and an emitter layer on the substrate, and growing a nitride interface layer on the base layer as a base current modulation means, such that the nitride interface layer is arranged between the base layer and the emitter layer.

7 Claims, 2 Drawing Sheets

METHOD OF MANUFACTURING AN ELECTRONIC DEVICE INCLUDING A PNP BIPOLAR TRANSISTOR

This patent application claims priority from German Patent Application No. 10 2008 010 323.3, filed 21 Feb. 2008, and from U.S. Provisional Patent Application No. 61/141,799, filed 31 Dec. 2008, the entireties of which are incorporated herein by reference.

FIELD OF THE INVENTION

The present invention generally relates to a method of manufacturing an electronic device including a PNP bipolar transistor and, more particularly, to an improved current gain control for a high performance vertical PNP transistor.

BACKGROUND

One of the general requirements for a high performance analog circuit is a good bipolar current gain control. In order to obtain and control the required current gains, interface oxide materials (IFO) are widely used. In an NPN transistor, the base current (holes) should be controlled with a thin oxide, which has to break up during thermal processing. However in a PNP transistor, the base current, in this case electrons, has to be controlled by an interface oxide that does not break up and maintains its structure so as to ensure its barrier properties.

For vertical PNP transistors it is a basic requirement to have an interface oxide with a very good uniformity and a high thermal stability, and for this purpose IFOs currently in use have a thickness in a range of 3-8 Å. However, IFOs as thin as 3-8 Å are not stable over more than one hour after they have been deposited during fabrication of the transistor. With specific surface treatment processing of the IFO, there may be a small increase in surface stability of the IFO, due to the formation of hydrogen bonds after cleaning, but over 2-3 hours the oxide starts to grow almost linearly with time depending on atmospheric and lighting conditions around the wafers upon which the PNP devices are being fabricated.

IFOs in the thickness range of 3-8 Å are also susceptible to break down upon post thermal treatment. The IFO has to have good stochiometry to withstand thermal cycles without the breakup effect seen in NPN processes, so as to avoid degradation effects and ensure reliable PNP characteristics. To achieve this stochiometry and quality, the process window has to be shifted to higher IFO temperatures, with reduced pressure and reduced oxygen partial pressures so as to reduce the oxidation rate to meet the required IFO thicknesses. This means that the process window becomes very narrow.

SUMMARY

Accordingly, the present invention provides a method of manufacturing an electronic device including a PNP bipolar transistor. The method comprises forming a collector in a substrate, depositing a base layer and an emitter layer on the substrate, and growing a nitride interface layer on the base layer as a base current modulation means, such that the nitride interface layer is arranged between the base layer and the emitter layer.

In a described embodiment, a collector region is formed as a P-well in a substrate. A base layer is then grown on the substrate, with an emitter layer being formed above the base layer. For modulating a base current, a base current modulation means, provided as a nitride interface layer, is deposited on top of the base layer so that the nitride interface layer is located underneath the emitter layer and between the base layer and the emitter layer. Using a nitride for the base current modulation means is beneficial because the characteristics of the nitride interface layer ensure good stability against additional oxygen penetration starting at room temperature conditions, which for oxide layers changes thickness and electrical performance of the component. In other words, the base current modulation means stays as it is and does not break up, which ensures its barrier properties. This means that time window constraints are much improved in the standard device manufacturing environment. A nitride interface layer supports more stable film characteristics during preprocessing phases at the emitter deposition process. Furthermore, using a nitride layer provides improved thermal stability against degradation in thermal cycles.

In particular implementations, the step of growing the nitride interface layer may take place at a temperature of from 450° C. to 900° C. Process temperatures to generate the nitride interface layer range from 450° C. to 900° C., depending on the thickness and film quality required for the corresponding transistor type.

The nitride interface layer needs more activation energy to grow than the interface oxide layer. However, the nitride interface layer is more resistant against subsequent processing steps. A disadvantage of an interface oxide layer is that it must be processed with Hf in order to clean the surface and for providing a termination of silicon surface with $H_2$. However, this termination lasts only one hour and starts reacting thereafter with oxygen. Therefore, thickness and quality of the interface oxide can hardly be controlled. In contrast thereto, the thickness and quality of the nitride interface layer are basically independent from the native oxide layer that may start growing after the clean-up of the silicon surface. The nitride interface layer thickness is controlled by temperature, time and concentration of the used substances. Furthermore, the treatment of the surface with $NH_3$ converts the existing oxide layer into $Si_3N_4$. This is a self-adjusting process. The higher temperatures used for the nitride provide a higher degree of independence from surface contamination and conditioning. Still further, the optimization of the components is basically decoupled from other components of an integrated circuit.

In one aspect of the invention, the nitride interface layer may have a thickness of between 2 Å and 12 Å. The nitride interface layer can be grown to a thickness of between 2 Å and 12 Å in the method of the present invention. By using a nitride layer, this creates more process headroom to deposit even thinner layers of 2-12 Å with a high accuracy and high thermal stability.

In another aspect of the invention, the nitride interface layer may have a thickness of greater than 12 Å. As well as being able to deposit very thin nitride layers, with the process of the present invention it is also possible to grow higher thicknesses of the nitride interface layer with even less thickness variation.

Preferably, the step of growing the nitride layer is carried out in pure $NH_3$. The nitride interface layer may be grown or deposited in a pure $NH_3$ environment. This means that the base current modulation means is formed of a pure interface nitride, with no oxygen present.

Alternatively, the step of growing the nitride layer may be carried out in a mixture of $NH_3$, $N_2$, $H_2$ and $O_2$, or with ultra low energy implanted ions of these elements either directly into an area of the base surface or through an ultrathin $SiO_2$ layer. Advantageously, the nitride layer can be generated by use of either $NH_3$ or $N_2$, or combinations of $NH_3$ and $O_2$, $NH_3$ and $H_2$, $N_2$ and $H_2$ or $N_2$ and $O_2$, but also by use of $NH_3$ and $N_2$, $NH_3$ and $N_2$ and $O_2$, or $NH_3$ and $N_2$ and $H_2$.

When the nitride layer is grown or generated in such a mixture, this allows a certain amount of oxide to be introduced into the nitride interface layer used as the current modulation means, and therefore to closely define electrical and thermal characteristics of the current modulation means. However, any other ambient mixture may be used. A nitride/oxide interface layer used as the base current modulation means also allows more process headroom to create thinner layers with high accuracy and thermal stability.

The nitride layer may be a $Si_3N_4$ layer, which can be deposited at any applied pressure to obtain a nitride or, alternatively, a nitride/oxide, interface layer for control or modulation of the base current.

In a further aspect of the invention, the method further comprises fabricating a CMOS transistor in the device process flow. The CMOS transistor is fabricated later in the process flow to match BiCMOS technology requirements/specifications. Having a nitride or nitride/oxide (i.e., a combination of nitride and oxide) interface layer as the base current modulation means is also advantageous for such BiCMOS technologies. Use of a nitride layer extends the BiCMOS process window to allow lower film or layer thicknesses and better film control at the same temperature and conditions as existing processes for deposition of the emitter layer and at the same time gives more process headroom for CMOS device optimization.

The present invention also provides an electronic device including a PNP bipolar transistor. The transistor comprises a substrate with a collector formed therein. A base layer and an emitter layer are provided on the substrate. Current modulation means are provided for controlling a base current. The current modulation means comprises a nitride interface layer arranged between the base and the emitter. A collector region is formed as a P-well in a substrate. A base layer is then grown on the substrate, with an emitter layer being formed above the base layer. In order to control a base current, base current modulation means implemented as a nitride interface layer is deposited on top of the base layer so that the nitride interface layer is located underneath the emitter layer and between the base layer and the emitter layer. Using a nitride for the base current modulation means gives a good stability against additional oxygen penetration and does not break up, which are the conditions required for base current control in a PNP transistor.

The nitride interface layer may also comprise an oxide material. A nitride/oxide interface layer (i.e., a layer including nitride and oxide) used as the current modulation means also gives an improved thermal stability and may be formed by depositing the nitride layer onto the base layer in the presence of oxygen.

In one aspect of the invention, the device may further comprise a CMOS transistor. The CMOS transistor can be integrated with the PNP transistor in a standard BiCMOS technology. This means that the PNP bipolar transistor in the BiCMOS device will be less susceptible to temperature variations during processing. A nitride interface layer is highly beneficial in such devices because it provides higher diffusion barrier characteristics and a larger process window for various process integration schemes. Furthermore, the nitride interface layer is able to fine tune the emitter outdiffusion characteristics without jeopardizing the increased AC performance.

BRIEF DESCRIPTION OF THE DRAWINGS

Further advantages and features of the invention will be apparent from the description of example embodiments, with reference to the accompanying drawings, in which.

DETAILED DESCRIPTION OF EXAMPLE EMBODIMENTS

Figure 1:
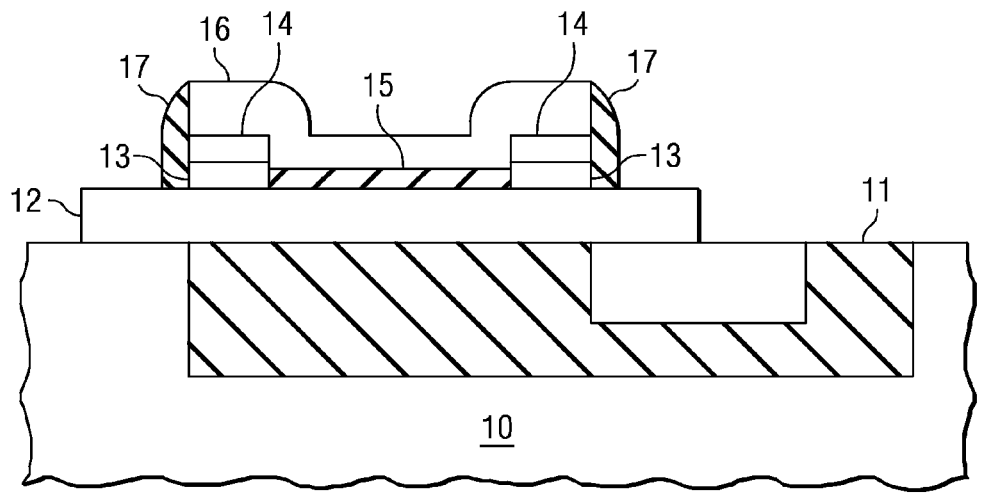
FIG. 1 is a simplified schematic of an electronic device including a PNP bipolar transistor according to an example embodiment of the invention.

FIG. 1 shows a simplified schematic of an electronic device according to the invention that includes a PNP bipolar transistor. A substrate 10, which can be an insulating material such as an oxide, is doped with silicon, for example, to form a P-well. The P-well forms a collector 11 for the PNP bipolar transistor. A base layer 12 is epitaxially grown on the substrate 10 above part of the collector 11. A central region of the base layer 12 is formed of an N-type crystalline material and a peripheral region of the base layer 12 is formed of a polycrystalline material. A nitride interface layer 15 is grown on top of the base layer 12 in the center of a surface of the base layer 12 that opposes the substrate 10 above the N-type crystalline region of the base layer 12. The nitride interface layer 15 is grown to a thickness of around 2-12 Å in a pure $NH_3$ environment. Adjacent to and surrounding the nitride interface layer 15, an oxide layer 13 is grown on the base layer 12 to cover the remaining area of the crystalline area of the base layer 12 not covered by the nitride interface layer 15. A nitride layer 14 is grown on top of the oxide layer 13 so as to completely cover the surface of the oxide layer 13. A P-type emitter layer 16 is then deposited on top of the nitride interface layer 15 above the central crystalline region of the base layer 12 so that it completely covers the exposed upper surfaces of the nitride interface layer 15 and the nitride layer 14. Sidewall spacers 17 are deposited around the edges of a stack comprising the oxide layer 13, the nitride layer 14 and the emitter layer 16 so that they extend from an uppermost surface of the emitter layer 16 (the surface of the emitter layer 16 furthest away from the substrate 10) to the top surface of the base layer 12 (the surface of the base layer 12 furthest away from the substrate 10) in the peripheral polycrystalline region of the base layer 12. However, some of the top surface of the polycrystalline region of the base layer 12 is left exposed.

The emitter layer 16 is therefore spaced from the base layer 12 by the nitride interface layer 15 and the stack formed of the oxide layer 13 with the nitride layer 14 deposited thereon. The nitride interface layer 15 acts as a base current modulator and serves to control current from the base layer 12. In an alternative embodiment, the growing of nitride interface layer 15 may be carried out in a mixture of $NH_3$, $N_2$, $H_2$ and $O_2$, or with low energy implanted ions of these elements directly into an area of the base surface or through an ultrathin $SiO_2$ layer. as Advantageously, the nitride layer can be generated, for example, by use of pure $NH_3$, or pure $N_2$, or combinations of $NH_3$ and $O_2$, $NH_3$ and $H_2$, $N_2$ and $H_2$ or $N_2$ and $O_2$, but also by use of $NH_3$ and $N_2$, $NH_3$ and $N_2$ and $O_2$, or $NH_3$ and $N_2$ and $H_2$. In some cases, the nitride interface layer 15 can contain a mixture of nitride and oxide. The nitride interface layer may also be grown to a thickness greater than 12Å.

Figure 2:
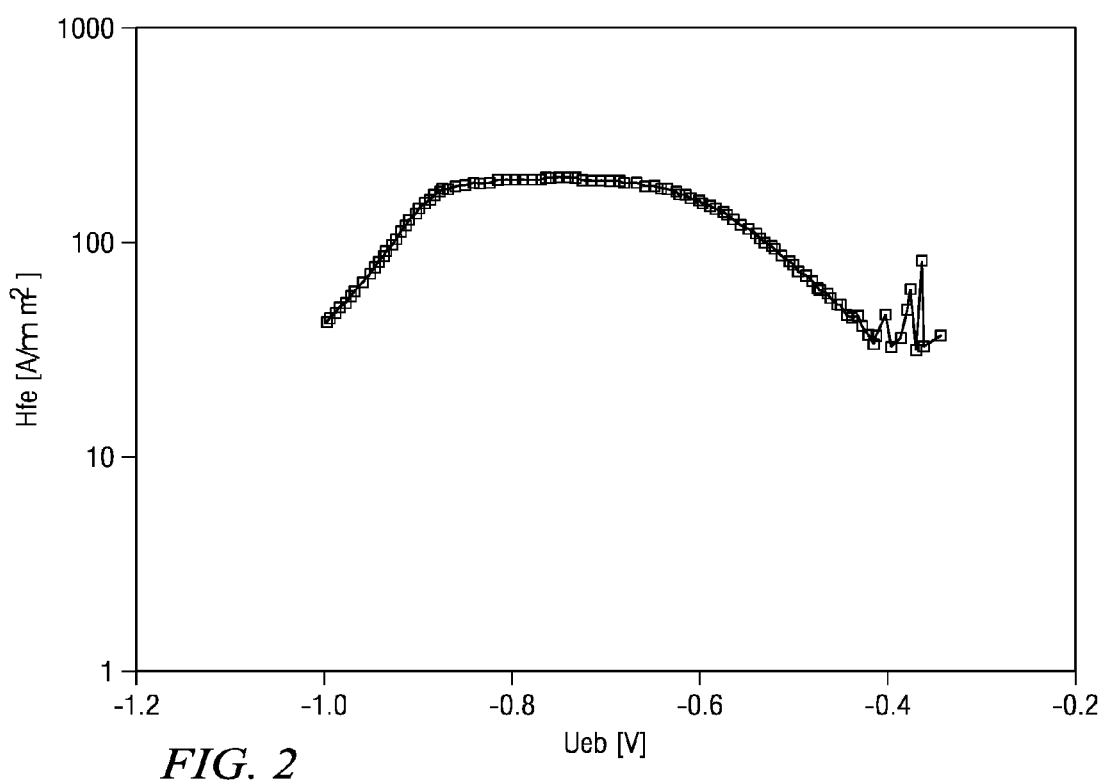
FIG. 2 is a graph of the current gain Hfe as a function of the base-emitter voltage for a conventional PNP bipolar transistor.
Figure 3:
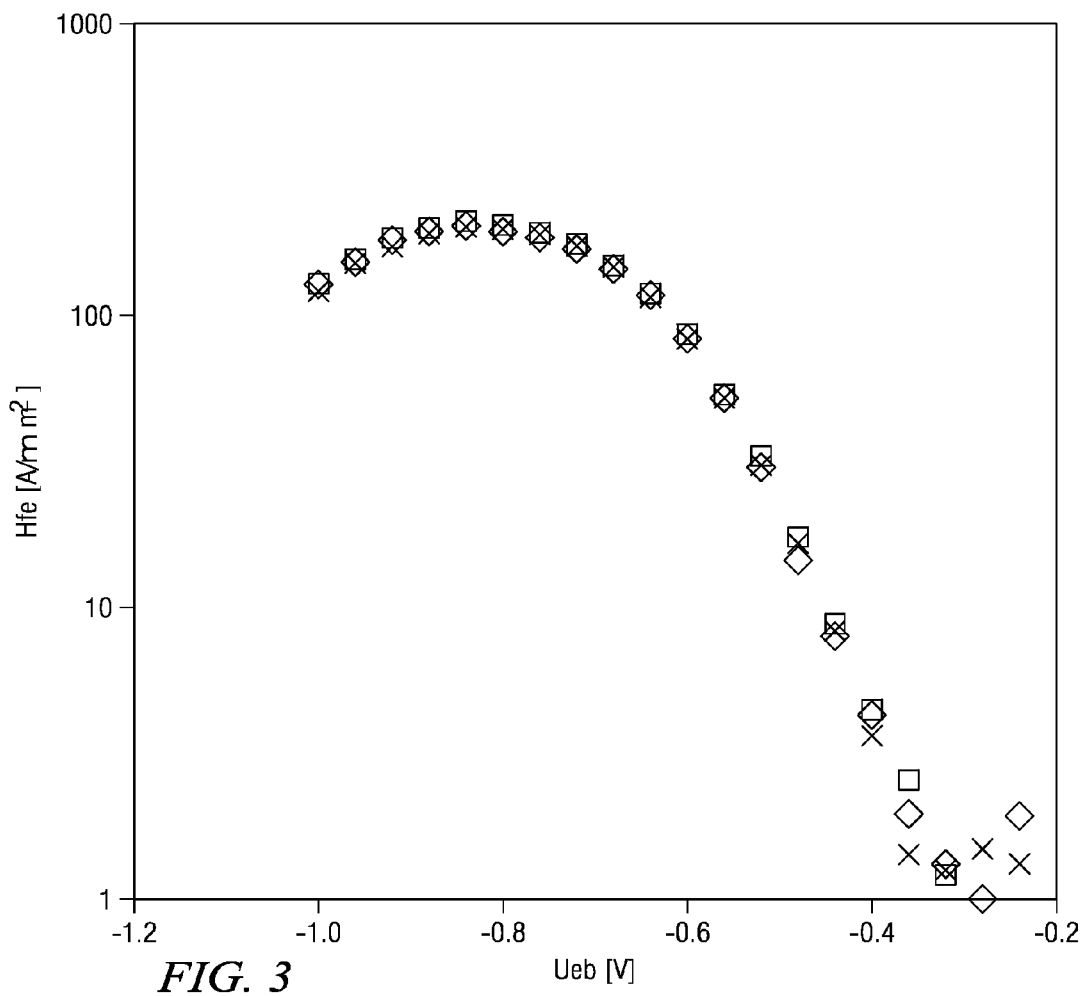
FIG. 3 is a graph of the current gain Hfe as a function of the base-emitter voltage for a PNP bipolar transistor according to the present invention.

An important electrical characteristic of a conventional PNP transistor and a PNP transistor according to the present invention is explained with respect to FIGS. 2 and 3. FIG. 2 shows a graph of the current gain Hfe as a function of the base-emitter voltage Ueb for a conventional PNP transistor having an interface oxide (IFO) for controlling the base current. The current gain Hfe=Ic/Ib, wherein Ic is the collector current and Ib is the base current. FIG. 2 relates to a collector current of about 400 µA. The flat plateau of the current gain Hfe between approximately −0.88 V and −0.64 V of the emitter-base voltage Ueb is the range, where the PNP transistor is typically used. The emitter area of the simulated conventional PNP transistor is $0.4 \times 3.2$ µm².

FIG. 3 shows a graph relating to the current gain Hfe as a function of the base-emitter voltage Ueb of a PNP transistor according to the present invention. The emitter area of the simulated device is $0.4 \times 3.2$ µm². Voltage Ueb is increased stepwise from −0.2 V to −1 V in steps of 40 mV. The transistor provides basically the same current gain and the curves are also sufficiently flat. FIG. 3 shows eight overlaid curves of the same PNP transistor for different simulation periods, i.e., for different periods of stress. The different durations used at each bias point (i.e., at each step of Ueb and with corresponding base and collector currents) for stressing the device are 0 s, 3.1 s, 10.3 s, 30.4 s, 100.5 s, 300.6 s, 1000.7 s and 1800.8 s. All points and thereby the complete curves, each of which relates to a different simulation or stressing time, overlap almost completely, which indicates that PNP transistors using IFN are very robust and stable over time. Accordingly, the PNP transistor with the IFN according to the present invention provides a good current gain characteristic over a broad range of emitter base voltage Ueb and stable characteristics over time.

Figure 4:
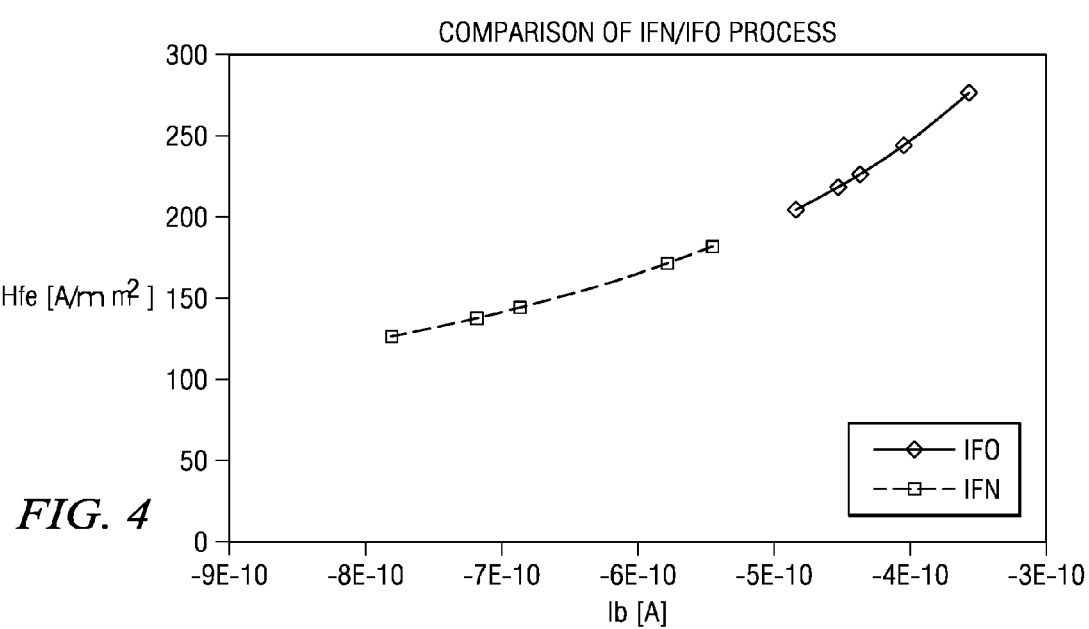
FIG. 4 is a graph of current gain as a function of base current for an electronic device including a PNP bipolar transistor according to the invention compared with a conventional device including a PNP bipolar transistor.

FIG. 4 shows a comparison of a PNP transistor with a conventional IFO layer and a PNP transistor with an IFN layer according to the present invention. The PNP current gain Hfe is indicated as a function of the base current Ib. FIG. 4 shows that the PNP transistor with the IFO layer and the PNP transistor with the IFN have basically the same characteristics. The only difference is that the PNP transistor with the IFO has a thinner IFO layer than the PNP transistor with the IFN. If either the thickness of the IFN or the thickness of the IFO were changed, the two separate curves would join each other and overlap almost completely. Within the simulated ranges shown in FIG. 4, the current gain is between 200 and 275 for a base current ranging from $-5 \times 10^{-10}$ A down to $-3,5 \times 10^{-10}$ A. For the PNP transistor according to the present invention, the current gain ranges from about 125 up to about 175 for a base current range from $-8 \times 10^{-10}$ A up to $-5 \times 10^{-10}$ A.

Although the present invention has been described with reference to specific embodiments, those skilled in the art will appreciate that other embodiments and modifications are within the scope of the claimed invention.

What is claimed is:

1. A method of manufacturing an electronic device including a PNP bipolar transistor, the method comprising:
    forming a collector in a substrate;
    depositing a base layer and an emitter layer on the substrate; and
    growing a nitride interface layer on the base layer as a base current modulator, with the nitride interface layer arranged between the base layer and the emitter layer;
    wherein the step of growing the nitride interface layer is carried out in a mixture of $NH_3$, $N_2$, $H_2$ and $O_2$.

2. The method of claim 1, wherein the step of growing the nitride interface layer takes place at a temperature of from 450° C. to 900° C.

3. The method of claim 1, wherein the nitride interface layer has a thickness of between 2 Å and 12 Å.

4. A method of manufacturing an electronic device including a PNP bipolar transistor, the method comprising:
    forming a P-well in a substrate to define a collector of the PNP bipolar transistor;
    forming a base layer epitaxially on the substrate above a portion of the P-well, a central region of the base layer being formed of an N-type crystalline material and a peripheral region being formed of a polycrystalline material;
    forming a nitride interface layer over a part of the central region of the base layer;
    forming an oxide layer adjacent to and surrounding the nitride interface layer over a remainder of the central region of the base layer not covered by the nitride interface layer;
    forming a nitride layer over the entirety of the oxide layer;
    forming a P-type layer over the nitride interface layer and the nitride layer to define an emitter of the PNP bipolar transistor; and
    forming sidewall spacers on edges of a stack comprising the oxide layer, the nitride layer and the P-type layer, the sidewall spacers extending from an uppermost surface of the P-type layer to a top surface in the peripheral region, leaving a portion of the top surface in the peripheral region exposed;
    whereby the P-type layer defining the emitter is spaced by the nitride interface layer from the base layer in a central portion and is spaced by the stack from the base layer in a peripheral portion.

5. The method of claim 4, wherein the nitride interface layer is formed to a thickness of around 2-12 Angstroms.

6. The method of claim 5, wherein the nitride interface is formed by growing the nitride interface layer in a pure $NH_3$ environment.

7. The method of claim 5, wherein the nitride interface layer comprises a mixture of nitride and oxide.

* * * * *